(12) United States Patent
Aizenberg et al.

(10) Patent No.: US 7,884,530 B2
(45) Date of Patent: Feb. 8, 2011

(54) REVERSIBLE ACTUATION IN ARRAYS OF NANOSTRUCTURES

(75) Inventors: Joanna Aizenberg, New Providence, NJ (US); Thomas Nikita Krupenkin, Warren, NJ (US); Oleksandr Sydorenko, Painted Post, NY (US); Joseph Ashley Taylor, Springfield, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 886 days.

(21) Appl. No.: 11/531,806

(22) Filed: Sep. 14, 2006

(65) Prior Publication Data

US 2008/0072357 A1    Mar. 20, 2008

(51) Int. Cl.
*H01L 41/08* (2006.01)
(52) U.S. Cl. ........................ 310/328; 310/800
(58) Field of Classification Search .......... 310/328, 310/800
See application file for complete search history.

(56) References Cited

U.S. PATENT DOCUMENTS

| | | | |
|---|---|---|---|
| 5,114,676 A | | 5/1992 | Leiner et al. |
| 5,350,966 A | * | 9/1994 | Culp ........................ 310/328 |
| 5,501,893 A | | 3/1996 | Laermer et al. |
| 6,066,911 A | * | 5/2000 | Lindemann et al. .... 310/323.02 |
| 6,222,303 B1 | * | 4/2001 | Nakamura et al. .......... 310/328 |
| 6,720,712 B2 | * | 4/2004 | Scott et al. ................ 310/339 |
| 6,864,620 B2 | * | 3/2005 | Takeuchi et al. ............ 310/334 |
| 7,061,161 B2 | * | 6/2006 | Scher et al. ................ 310/328 |
| 7,075,213 B2 | * | 7/2006 | Krill .......................... 310/328 |
| 2003/0098632 A1 | * | 5/2003 | Takeuchi et al. ............ 310/328 |
| 2004/0173506 A1 | | 9/2004 | Doktycz et al. |
| 2004/0191127 A1 | | 9/2004 | Kornblit et al. |
| 2004/0201324 A1 | * | 10/2004 | Takeuchi et al. ............ 310/328 |
| 2005/0024730 A1 | | 2/2005 | Aizenberg et al. |
| 2005/0039661 A1 | | 2/2005 | Kornblit et al. |
| 2005/0162049 A1 | * | 7/2005 | Krill .......................... 310/800 |
| 2006/0122565 A1 | | 6/2006 | Kooi |
| 2006/0158065 A1 | * | 7/2006 | Pelrine et al. ............... 310/328 |
| 2007/0056853 A1 | | 3/2007 | Aizenberg et al. |
| 2007/0058483 A1 | | 3/2007 | Aizenberg et al. |
| 2007/0059213 A1 | | 3/2007 | Aizenberg et al. |
| 2007/0077396 A1 | | 4/2007 | Aizenberg et al. |
| 2007/0237937 A1 | | 10/2007 | Aizenberg et al. |

FOREIGN PATENT DOCUMENTS

JP      2005304212 A    10/2005

OTHER PUBLICATIONS

Definition for "Support" available at http://dictionary.reference.com/browse/support (2009).

(Continued)

*Primary Examiner*—J. SanMartin
(74) *Attorney, Agent, or Firm*—Hitt Gaines, PC

(57) ABSTRACT

The present invention provides, in one embodiment, an apparatus. The apparatus, without limitation, may include a substrate with a surface, and a polymer layer attached to a region of the surface. The apparatus may further include a plurality of nanostructures, a first end of each nanostructure being in the polymer layer and a second end of each nanostructure protruding through the polymer layer, wherein the nanostructures are configured to move from a first position to a second position in response to a change in thickness of the polymer layer from a first thickness to a second thickness.

20 Claims, 9 Drawing Sheets

OTHER PUBLICATIONS

Agarwal, Abhishek K. et al.; "Programmable Autonomous Micromixers and Micropumps"; Journal of Microelectromechanical Systems, vol. 14, No. 6, Dec. 2005; pp. 1409-1421.

Beebe, David J. et al.; "Functional Hydrogel Structures For Autonomous Flow Control Inside Microfluidic Channels"; Nature vol. 404, Apr. 6, 2000, www.nature.com; pp. 588-590.

* cited by examiner

REVERSIBLE ACTUATION IN ARRAYS OF NANOSTRUCTURES

The U.S. Government has a paid-up license in this invention and the right in limited circumstances to require the patent owner to license others on reasonable terms as provided for by the terms of Contract No. N 00014-05-1-0909 awarded by Office of Naval Research.

TECHNICAL FIELD OF THE INVENTION

The present invention is directed, in general, to nanostructures and, more specifically, to reversible actuation in arrays of nanostructures.

BACKGROUND OF THE INVENTION

Synthetic routes, fabrication strategies and engineering solutions leading to new-generation, dynamically-tunable materials are often inspired by biological systems that show a wide range of adaptive responses. Recently, a number of studies have demonstrated that various physico-chemical properties of biological materials that are generally vital for an organism's survival arise from the presence of highly developed surface nanoroughness and exquisite nano-micro-features. For example, nano-microstructures developed on the surface of gekko feet, lotus leaves, and cicada and butterfly wings enable exceptional adhesive, self-cleaning, water-repelling and photonic properties. Such features have become textbook examples of "smart" biological nanomaterials.

Several efforts have been made to artificially produce nanostructured surfaces to mimic the unique biological structures and their functions. For instance, one effort includes the fabrication of nanostructured surfaces (e.g., regular arrays of well-defined nanostructures with feature sizes of about 300 nm and aspect ratios reaching 100) in silicon using deep reactive ion etching. These structures are stable, and their geometry is highly controlled. Their rigidity, however, makes them unsuitable for use in adaptive materials and devices. For example, they are structurally unchangeable, and thus their geometry is inherently non-responsive.

In an alternative effort, a wide range of artificial responsive materials, mostly involving polymers, have been used. Hydrogels are prominent examples of such materials. In this effort, the nanostructures themselves were defined by the artificially responsive material. Interestingly, the intrinsic flexibility of artificial responsive materials frequently leads to undesired design outcomes, as the features in the soft materials are generally poorly controlled and often susceptible to irreversible collapse.

Accordingly, what is needed in the art are artificially produced nanostructured surfaces that do not experience the problems of conventional structures.

SUMMARY OF THE INVENTION

To address the above-discussed deficiencies of the prior art, the present invention provides, in one embodiment, an apparatus. The apparatus, without limitation, may include a substrate with a surface, and a polymer layer attached to a region of the surface. The apparatus may further include a plurality of nanostructures, a first end of each nanostructure being in the polymer layer and a second end of each nanostructure protruding through the polymer layer, wherein the nanostructures are configured to move from a first position to a second position in response to a change in thickness of the polymer layer from a first thickness to a second thickness.

The present invention, in another embodiment, provides a method for using an apparatus. The method for using the apparatus, in one instance, may include providing an apparatus similar to that discussed directly above, and exposing the polymer layer to a stimulus, the stimulus changing a thickness of the polymer layer from a first thickness to a second thickness and thereby moving the nanostructures from a first position to a second position.

The present invention, in yet another embodiment, provides a method for manufacturing an apparatus. The method for manufacturing the apparatus, among other steps, includes (1) providing a substrate with a surface, and (2) forming a plurality of nanostructures, a first end of each nanostructure being in a polymer layer attached to a region of the surface and a second end of each nanostructure protruding through the polymer layer, wherein the nanostructures are configured to move from a first position to a second position in response to a change in thickness of the polymer layer from a first thickness to a second thickness.

BRIEF DESCRIPTION OF THE DRAWINGS

The various embodiments can be understood from the following detailed description, when read with the accompanying figures. Various features may not be drawn to scale and may be arbitrarily increased or reduced in size for clarity of discussion. Reference is now made to the following descriptions taken in conjunction with the accompanying drawings, in which.

DETAILED DESCRIPTION

The present invention is based, at least in part, on the acknowledgement that nanostructures defined by a rigid medium, such as silicon, as well as nanostructures defined within a flexible medium, such as a polymer, when used alone, provide inferior "smart" artificial nanostructures. For example, the present invention has acknowledged that nanostructures defined by the rigid medium lack the responsiveness desired in the "smart" artificial nanostructures, while the nanostructures defined by the flexible medium lack the stability desired in such structures.

Based upon the foregoing acknowledgements, the present invention recognizes that a more promising approach is to create a "smart" artificial nanostructure based on a hard-soft combination, which capitalizes on the beneficial properties of the different materials. In such a design, the hard medium brings about the rigidity, structure and precision, whereas the softer medium brings about responsive behavior. Accordingly, a "smart" artificial nanostructure capable of reversibly adjusting its surface geometry at the nano and microscale is attainable.

The present invention recognizes that such a hard-soft combination may be achieved by providing a volume-tunable-material (e.g., a polymer layer) having a plurality of nanostructures at least partially therein. For instance, a first end of each of the nanostructures would be in the volume-tunable-material, whereas a second end of each of the nanostructures would be protruding through the volume-tunable-material. In such a design, the nanostructures, often rigid, would move (e.g., tilt in one instance) from a first position to a second position in response to a change in thickness of the volume-tunable-material. The change in thickness of the volume-tunable-material may be necessitated by the introduction of a stimulus, for example a moisture change, temperature change, magnetic field change, electrical field change, pH change, ion concentration change, another similar change or any combination thereof.

An apparatus manufactured in accordance with the principles of the present invention provides many benefits over the previously discussed devices. For example, such an apparatus may achieve previously unattainable dynamic tuning of the surface geometry on the micron and submicron scale. Moreover, a variety of complex patterns with switchable features can be formed. Additionally, the actuation process is fast, reproducible and robust. Accordingly, these new architectures and dynamic patterns may lead to a variety of applications, including actuators, artificial muscles, tunable photonic structures, micro-electromechanical systems, release systems, reversible switching of the wetting behavior and controlled reversible pattern formation, among others, which were not previously available.

Figure 1A:
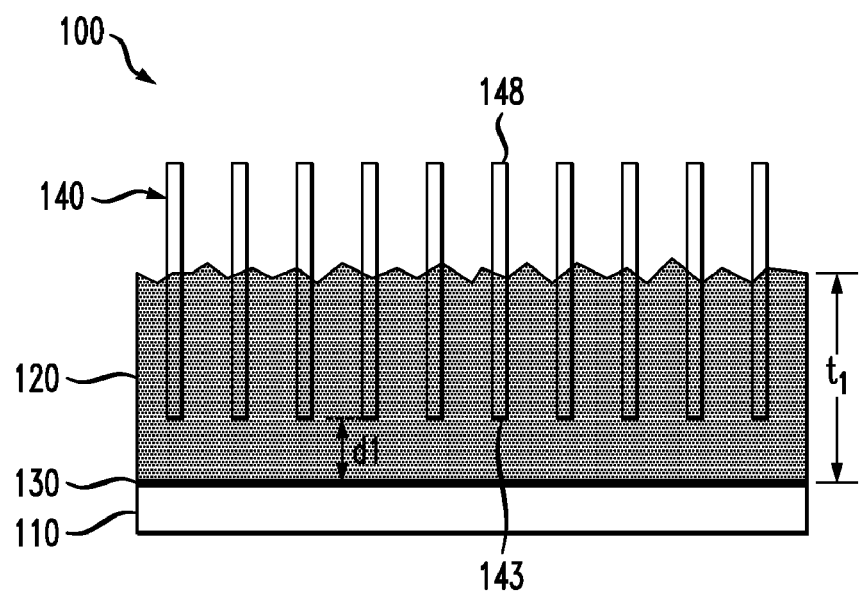
FIGS. 1A and 1B illustrate cross-sectional views of an apparatus at different stages of use.
Figure 1B:
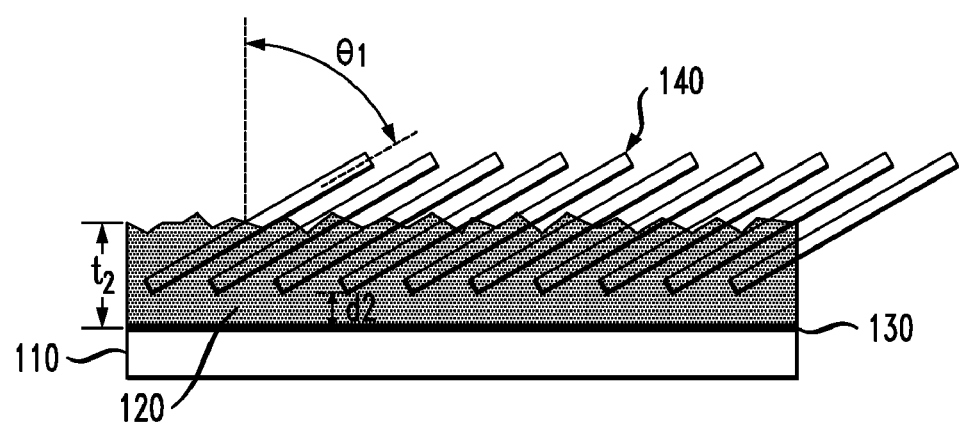

Turning now to FIGS. 1A and 1B, illustrated are cross-sectional views of an apparatus 100 at different stages of use. The apparatus 100 initially includes a substrate 110. The substrate 110, in one embodiment, comprises a planar substrate. For instance, the substrate 110 may comprise a silicon wafer in one embodiment. In an alternative embodiment, the substrate 110 may comprise any material used as a confining surface, as will be discuss more fully below. In yet an even different embodiment, the substrate 110 may comprise a silicon-on-insulator (SOI) wafer. Accordingly, the SOI wafer would generally have an insulating layer of silicon oxide disposed between upper and lower silicon layers. Additionally, the substrate 110 may be topographically patterned, as opposed to flat in other embodiments. Of course, in other embodiments, the substrate 110 can comprise a single layer or plurality of planar layers made of other conventional materials.

Positioned over the substrate 110 is a volume-tunable-material, in this instance a polymer layer 120. The polymer layer 120 may be either organic or inorganic. In one embodiment, however, the polymer layer 120 is a hydrogel layer. Nevertheless, the polymer layer 120 may comprise other known or hereafter discovered materials that function as a volume-tunable-material.

In the embodiment shown, the polymer layer 120 is attached to a region of the substrate 110 using an anchoring layer 130. The anchoring layer 130, in this embodiment, acts as an adhesive layer configured to attach the substrate 110 and polymer layer 120. In one embodiment, the anchoring layer 130 of poly (glycidylmethacrylate) (PGMA) can be covalently bonded to both the substrate 110 and the polymer layer 120 of polyacrylamide hydrogel. Examples of forming a PGMA layer and coupling it to a polyacrylamide hydrogel layer are presented in U.S. patent application Ser. Nos. 10/773,120, and 11/239,973, which are incorporated by reference herein in their entirety.

Positioned within at least a portion of the polymer layer 120 is a plurality of nanostructures 140. The term nanostructure as used herein refers to a predefined raised isolated feature on a surface that has at least one dimension that is about 1 micron or less. The plurality of nanostructures 140, without limitation, may comprise an array of nanoposts. The term post, as used herein, includes any structures having round, square, rectangular or other cross-sectional shapes. The plurality of nanostructures 140 depicted in FIGS. 1A and 1B are post-shaped, and more specifically, cylindrically shaped posts. Alternatively, the plurality of nanostructures 140 may comprise an array of nanoposts, a plurality of nanoplates, etc. Accordingly, the present invention should not be limited to any specific nanofeature.

In the embodiment shown, a first end 143 of each of the plurality of nanostructures 140 is in the polymer layer 120 while a second end 148 of each of the plurality of nanostructures 140 protrudes through the polymer layer 120. This part-in/part-out configuration is important to the movement, or actuation in one embodiment, of the plurality of nanostructures 140. Such a movement, or actuation, will be discussed more fully below. The plurality of nanostructures 140 of FIG. 1A are additionally separated from the substrate 110 by a distance ($d_1$) in their untilted state. This distance ($d_1$) may vary, however, in one embodiment it ranges from about 5.0 μm to about 10 μm. Other embodiments, discussed more fully below, exist wherein the distance ($d_1$) is zero and the plurality of nanostructures are attached to the substrate.

The apparatus 100 of FIGS. 1A and 1B may be used by, for example, exposing the polymer layer 120 to a stimulus, the stimulus changing a thickness thereof. As the thickness of the polymer layer 120 changes, for example from a first thickness ($t_1$) to a second thickness ($t_2$), the plurality of nanostructures 140 move from a first position (e.g., the position of FIG. 1A) to a second position (e.g., the position of FIG. 1B). In the illustrative embodiment of FIGS. 1A and 1B, the change in thickness of the polymer layer 120 causes the plurality of nanostructures 140 to tilt from a first position that is substantially normal to the substrate 110 to a second position that has the plurality of nanostructures at an angle ($\theta_1$) from the first position. The change in thickness also causes the plurality of nanostructures 140 of FIG. 1B to be separated from the substrate 110 by a distance ($d_2$) in their tilted state. This distance ($d_2$) may vary, however, in one embodiment it ranges from about 0.5 μm to about 3.0 μm.

The ability to tilt the plurality of nanostructures 140 a given angle ($\theta_1$) is dependent upon a number of factors. First, it depends on the amount of change in thickness that may be attained between the expanded polymer layer 120 and the contracted polymer layer 120. The greater the change in thickness, the greater the tilt, and thus the higher the angle ($\theta_1$). Second, it depends on the amount (e.g., length) of the plurality of nanostructures 140 that are located within the polymer layer 120 as opposed to protruding out of the polymer layer 120. Other factors may also affect the degree of tilt. Nevertheless, an apparatus such as the apparatus 100 of FIGS. 1A and 1B may be capable of achieving a tilt angle ($\theta_1$) from about 0 degrees to about 75 degrees, or any value in that range. The actual degree of tilt may be based on many different factors, particularly the layout of the apparatus 100 and the stimulus chosen.

Again, the thickness of the polymer layer 120 may be changed by exposing it to a stimulus, whether it is a physical or chemical change in the environment surrounding the polymer layer 120. In some cases, the change in thickness, and thus volume transition, is caused by a change in the moisture content of the polymer layer 120. In other cases, the change in thickness is caused by a temperature change, magnetic field change, electrical field change, pH change, ion concentration change, or another similar change. Accordingly, any stimulus capable of changing the thickness of the polymer layer 120 might be used.

After the thickness of the polymer layer 120 has changed from a first thickness ($t_1$) to a second thickness ($t_2$), the thickness of the polymer layer 120 may then return back to the first thickness ($t_1$). Such a reversal, in one exemplary embodiment, causes the plurality of nanostructures 140 to substantially, if not completely, return to the first position. Accordingly, the apparatus 100 may be actuated over and over again, each time the plurality of nanostructures 140 returning to the original state.

As one skilled in the art would expect, the reversal of the thickness of the polymer layer 120 back to the initial thickness ($t_1$) may be accomplished by subjecting the polymer layer 120 to an opposite stimulus as it was originally subjected to, or just removing the existence of the original stimulus. For instance, if a heating source was used to cause the thickness of the polymer layer to change from the first thickness ($t_1$) to the second thickness ($t_2$), the polymer could then be subjected to a cooling source to return the polymer layer 120 back to the first thickness ($t_1$). Alternatively, if moisture was used to cause the initial change in thickness, the environment could be allowed to dry, and thereby return the polymer layer 120 to the first thickness ($t_1$).

Unique to the present invention, an apparatus manufactured and used in accordance with the principles of the present invention may achieve very fast response times. For instance, when a water droplet is placed on a polymer layer in a contracted state, such as that shown in FIG. 1B, it may take only about 60 milliseconds to move to an expanded state, such as that shown in FIG. 1A. Additionally, the reverse transformation of the polymer layer back to the contracted state may only take about 4 seconds, if unassisted by drying. Obviously, this time would be greatly accelerated if the drying process were facilitated using airflow in the system and/or by increasing the temperature. It is believed that similar switching speeds might be obtained for all the various embodiments of the present invention.

Figure 2:
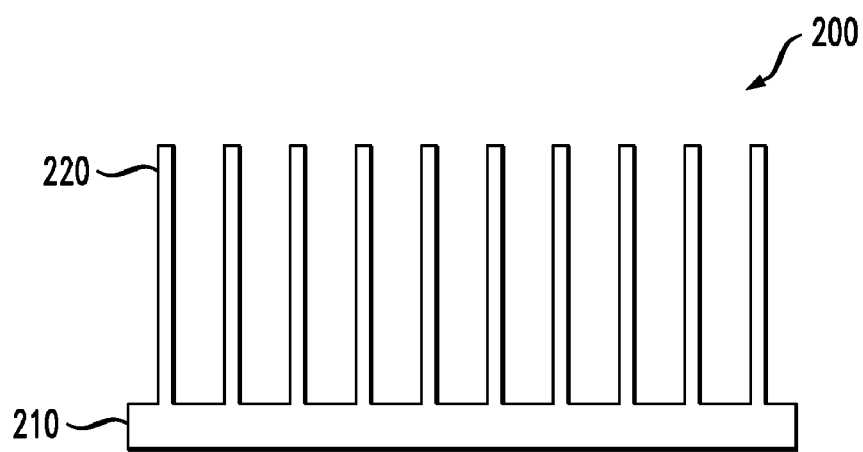
FIGS. 2-6 illustrate cross-sectional views showing how one might manufacture an apparatus in accordance with the principles of the present invention.

Turning now to FIGS. 2-6, shown are cross-sectional views illustrating how one might manufacture an apparatus 200 in accordance with the principles of the present invention. FIG. 2 shows the apparatus 200 at an initial stage of manufacture. The apparatus 200 of FIG. 2 includes a substrate 210 having a plurality of nanostructures 220 formed thereover. The substrate 210 may comprise similar materials as the substrate 110. The plurality of nanostructures 220, in the embodiment shown, comprise well-defined nanocolumns with diameters of about 200-300 nm, heights of about 5-10 μm and periodicities of about 2-4 μm. Accordingly, the plurality of nanostructures 220 are arrays of isolated high-aspect-ratio rigid structures (AIRS). Nevertheless, other layouts might be used.

The plurality of nanostructures 220 may be manufactured using many different processes. In one embodiment, however, the plurality of nanostructures 220 may be formed from a surface of a silicon or silicon-on-insulator substrate by conventional photolithographic and dry reactive ion etching (DRIE) procedures. For example, a DRIE process such as the Bosch process, as presented in U.S. Pat. No. 5,501,893, which is incorporated herein by reference as if entirely reproduced herein, could be used to define the plurality of nanostructures 220. Nevertheless, other processes might also be used to form the plurality of nanostructures 220.

After defining the plurality of nanostructures 220, for example using the Bosch process, the plurality of nanostructures 220 may be cleaned. In one embodiment, the plurality of nanostructures 220 are cleaned using an argon (Ar) plasma, and are then allowed to mature at conditions configured to allow the formation of silanol groups.

Figure 3:
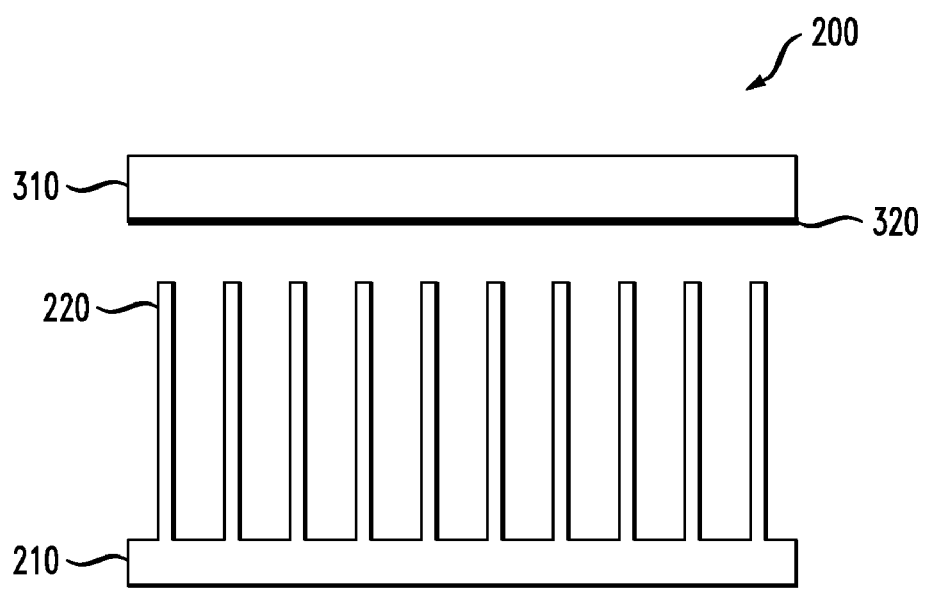

Turning now to FIG. 3, illustrated is the apparatus 200 of FIG. 2 after positioning a confining surface 310 over the plurality of nanostructures 220. The confining surface 310, in one embodiment, comprises a silicon wafer. Nevertheless, other embodiments exist wherein the confining surface 310 comprises a different material.

Attached to a surface of the confining surface 310 is an anchoring layer 320. The material composition and thickness of the anchoring layer 320 may vary greatly while remaining within the purview of the present invention. However, one exemplary embodiment exists wherein the anchoring layer 320 of poly (glycidylmethacrylate) (PGMA) is deposited from about 1% solution in methylethyl ketone (MEK) upon the confining surface 310. The resulting thickness of the anchoring layer 320, at least in this instance, ranges from about 1.0 nm to about 1.5 nm.

After forming the anchoring layer 320, it may be annealed at about 110° C. for about 15 minutes. Such an anneal step attempts to ensure the formation of covalent bonds between the epoxy groups of the PGMA and the silanol groups on the confining surface 310 surface. Thereafter, further modification with acrylic acid (AcA) allows the introduction of reactive acrylic groups due to the reaction of the remaining epoxy groups of the PGMA with carboxyl groups of AcA.

Figure 4:
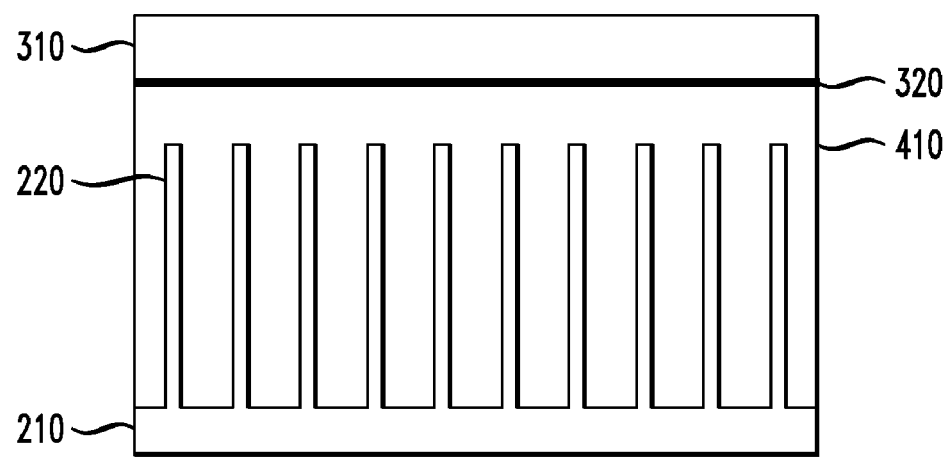

Turning now to FIG. 4, illustrated is the apparatus 200 of FIG. 3 after sandwiching a polymerizate solution 410 between the substrate 210 and the confining surface 310, and thus surrounding the plurality of nanostructures 220 with the polymerizate solution 410. The polymerizate solution 410 may be placed between the substrate 210 and the confining surface 310 using many different processes; however, in one embodiment the polymerizate solution 410 is deposited there between by dip coating or drop casting. Other placement methods could nonetheless also be used.

Depending on the design of the device, the polymerizate solution 410 may vary. In the given embodiment of FIG. 4, however, the polymerizate solution 410 includes acrylamide (AA) in water solution, with a cross linking agent (e.g., N,N'-methylenebisacrylamide (bis-AA)) and an initiator (e.g., ammonium persulfate (APS)). In this embodiment the polymerizate solution 410 might include about 40 wt % of AA, about 2 wt % of bis-AA and about 2 wt % of APS in water. Such a polymerizate solution 410 might result in a polymer layer that changes its thickness based upon moisture changes. Those skilled in the art of polymer chemistry, would nonetheless understand the different polymerizate solutions 410 that might be used herein.

Figure 5:
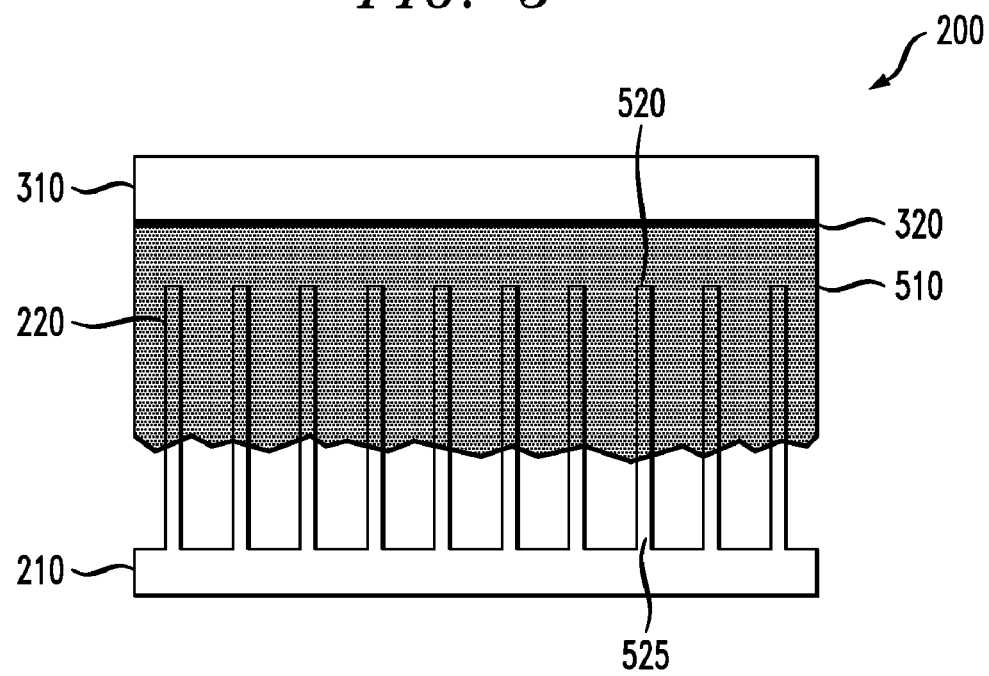

Turning now to FIG. 5, illustrated is the apparatus 200 of FIG. 4 after subjecting the polymerizate solution 410 to a thermo-initiated polymerization step, and thereby forming a polymer layer 510. The thermo-initiated polymerization step, in one embodiment, includes placing the apparatus 200 having the polymerizate solution 410 within a heat source and annealing the structure at about 50° C. for about 1 hour to initiate polymerization. Those skilled in the art understand, however, that the time for the polymerization reaction may vary with the desired thickness of the final polymer layer 510. Accordingly, the disclosed time is but one disclosed example.

The polymer layer 510 resulting from the aforementioned polymerizate solution 410 might be responsive to changes in moisture. For instance, a stimulus consisting of moisture could be used to change the thickness of the polymer layer 510, and thus move the plurality of nanostructures 220, such as was discussed above with respect to FIGS. 1A and 1B. Alternatively, however, the polymer layer 510 might comprise hydrogels such as N-isopropylacrylamide and N,N'-methylenebisacrylamide that can swell by at least about five times as the temperature is lowered from above 37° C. to below 32° C. (e.g., a change in temperature of at least about 5° C.).

Alternatively, the polymer layer 510 can comprise hydrogels that swell and contract significantly in response to variations in the pH of a fluid located thereby. Examples of pH-sensitive hydrogels include polymers of hydroxyethyl methacrylate-co-methacrylic acid and tetraethylene glycol dimethacrylate. These polymers may swell substantially more under basic conditions than under acidic conditions. Alternately, some hydrogels can swell and contract significantly in response to changes of a metal ion concentration in a fluid located thereby, e.g., a variation in a Cu, Ni, Co, and Pd ion concentration. Examples of such metal ion-sensitive hydrogels include polymers of acryl amide-co-2-vinylpyridine and N,N'-methylenebisacrylamide.

The resulting polymer layer 510, as is illustrated, is attached to the confining surface 310 via the anchoring layer 320. Moreover, the plurality of nanostructures 220 are located within the polymer layer 510. More specifically, the first end 520 of each of the plurality of nanostructures 220 is in the polymer layer 510 wherein the second end 525 of each of the plurality of nanostructures 220 protrudes through the polymer layer 510.

Figure 6:
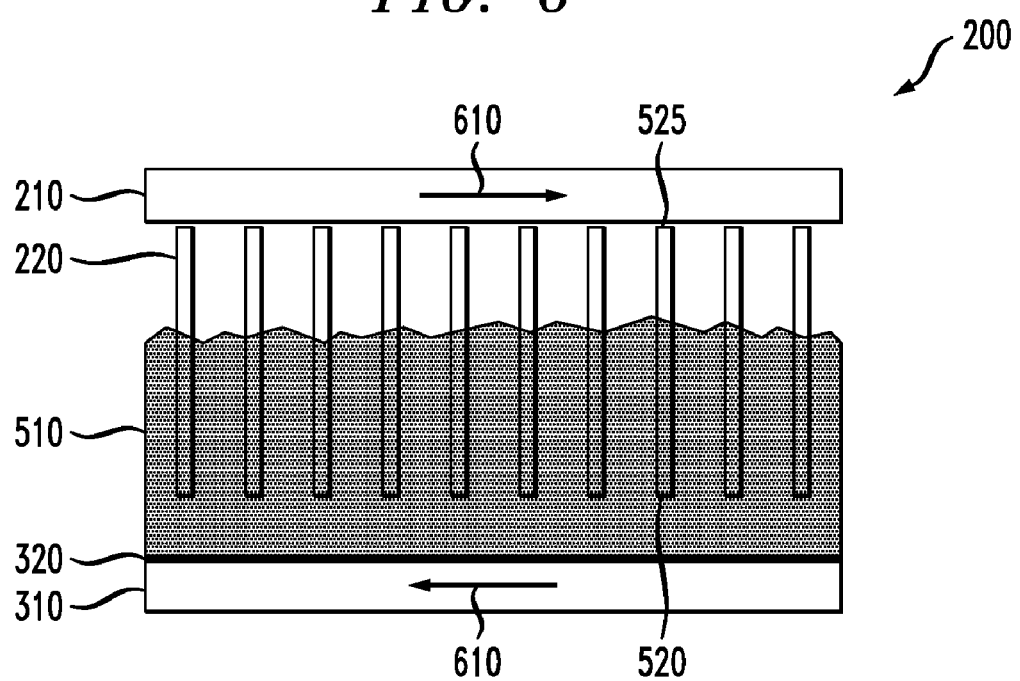

Turning now to FIG. 6, illustrated is the apparatus 200 of FIG. 5 after separating the substrate 210 from the confining surface 310. For example, by applying a shear stress 610, the substrate 210 and the confining surface 310 may be separated. As a result of AA polymerization in-situ, the hydrogel film remains attached to the substrate 310 via the anchoring layer 320. Thus, the plurality of nanostructures 220 embedded into the polymer layer 510 appear better attached thereto than to the substrate 210. Accordingly, the plurality of nanostructures 220 get detached from the substrate 210 and fully transferred onto the confining surface 310.

After separating the substrate 210 and the confining surface 310, the apparatus 200 may be rinsed to remove unreacted monomers and cross-linked molecules therefrom. Thereafter, the apparatus 200 may be dried in a vacuum, thus resulting in the contracted polymer layer 510 with tilted nanostructures.

What often ultimately results from the process of FIGS. 2-6 is an apparatus substantially similar to the apparatus 100 of FIGS. 1A and 1B. Accordingly, the substrate 110 of FIGS. 1A and 1B is substantially similar to the confining surface 310 of FIGS. 3-6. Likewise, the plurality of nanostructures 210 of FIG. 6, as well as the plurality of nanostructures 140 of FIG. 1, are separated from the confining surface 310 and substrate 110, respectively.

Additional details for forming an apparatus in accordance with the principles of the present invention may be found in U.S. patent application Ser. No. 11/279,220, entitled "Environmentally Sensitive Nanostructured Surfaces", which is incorporated by reference as if reproduced herein in its entirety.

Figure 7A:
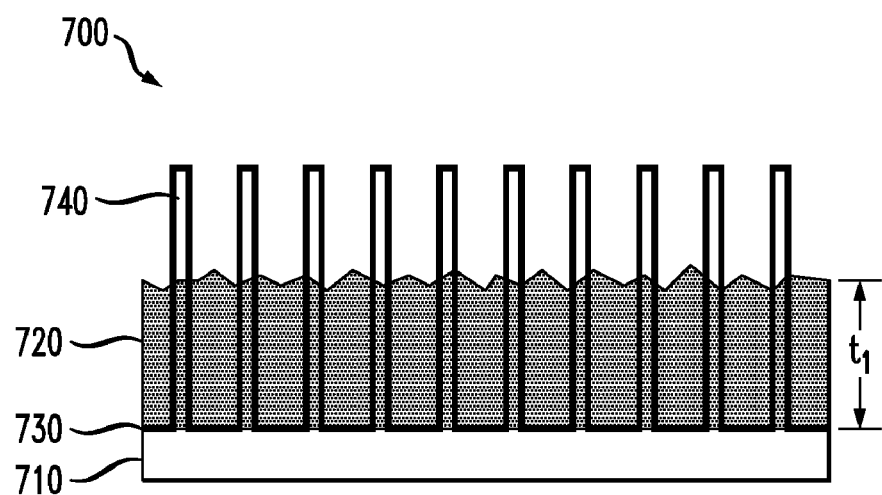
FIGS. 7A and 7B illustrate cross-sectional views of an alternative embodiment of an apparatus at different stages of use.
Figure 7B:
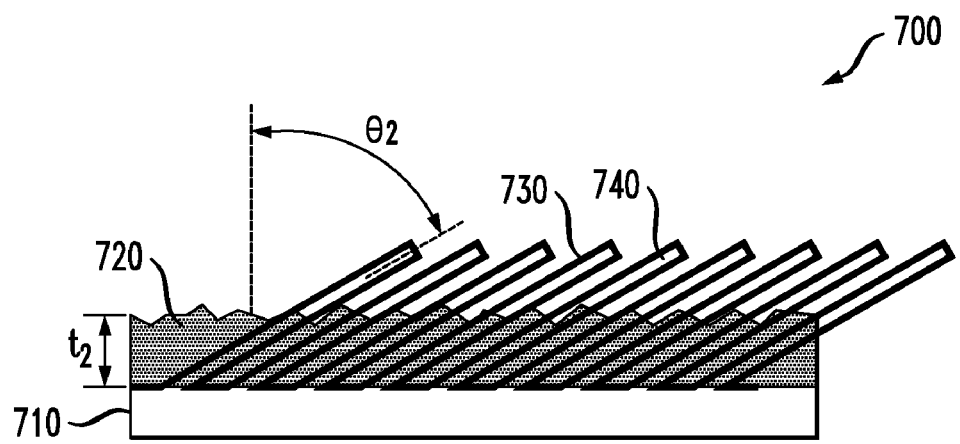

Turning now to FIGS. 7A and 7B, illustrated are cross-sectional views of an alternative embodiment of an apparatus 700 at different stages of use. The apparatus 700 of FIG. 7 is very similar to the apparatus 100 of FIG. 1. Accordingly, the apparatus 700 includes a substrate 710, a polymer layer 720, an anchoring layer 730 attaching the polymer layer 720 to the substrate 710, and a plurality of nanostructures 740 positioned at least partially within the polymer layer 720. A difference between the apparatus 100 and the apparatus 700, is the method of manufacture therefore, as well as the fact that the plurality of nanostructures 740 of FIGS. 7A and 7B are attached to a surface of the substrate 710, as compared to the plurality of nanostructures 140 of FIGS. 1A and 1B being suspended in the polymer layer 120 over the surface 110. Another difference is the location of the anchoring layer 730.

The apparatus 700 of FIGS. 7A and 7B would be operated in a similar manner as the apparatus 100 of FIGS. 1A and 1B. Accordingly, the polymer layer 720 may be exposed to a stimulus to change its thickness, and thereby move the plurality of nanostructures 740 from a first position to a second position. The apparatus 700 of FIGS. 7A and 7B may also return the plurality of nanostructures 740 from the second position substantially back to the first position, by exposing the apparatus 700 to an opposite stimulus or just removing the original stimulus. The apparatus 700 is capable of achieving a tilt angle ($\theta_2$) of about 50 degrees to about 65 degrees.

Figure 8:
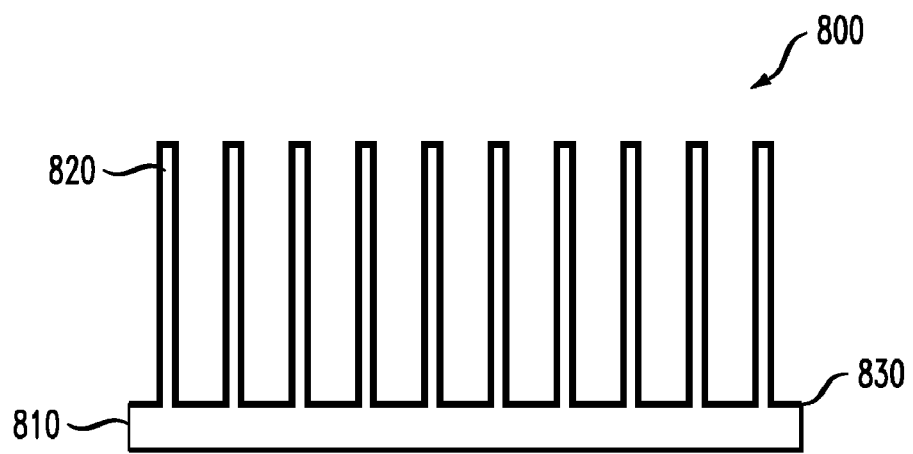
FIGS. 8-11 illustrate cross-sectional views showing how one might manufacture an alternative embodiment apparatus in accordance with the principles of the present invention.

Turning now to FIGS. 8-11, shown are cross-sectional views illustrating how one might manufacture an alternative embodiment of an apparatus 800 in accordance with the principles of the present invention. FIG. 8 shows the apparatus 800 at an initial stage of manufacture. The apparatus 800 of FIG. 8 includes a substrate 810 and a plurality of nanostructures 820 attached to the substrate 810. The substrate 810 and plurality of nanostructures 820 may be formed using similar processes as used to form the substrate 210 and plurality of nanostructures 220 discussed with respect to FIG. 2. Therefore, no further detail need be given.

In the embodiment of FIG. 8, however, an anchoring layer 830 is formed over the substrate 810 and the plurality of nanostructures 820. The anchoring layer 830 may be substantially similar to the anchoring layer 320 of FIG. 3, with the exception of location. Accordingly, in one embodiment the anchoring layer 830 comprises PGMA. Obviously, the anchoring layer 320 may comprise other different materials.

Figure 9:
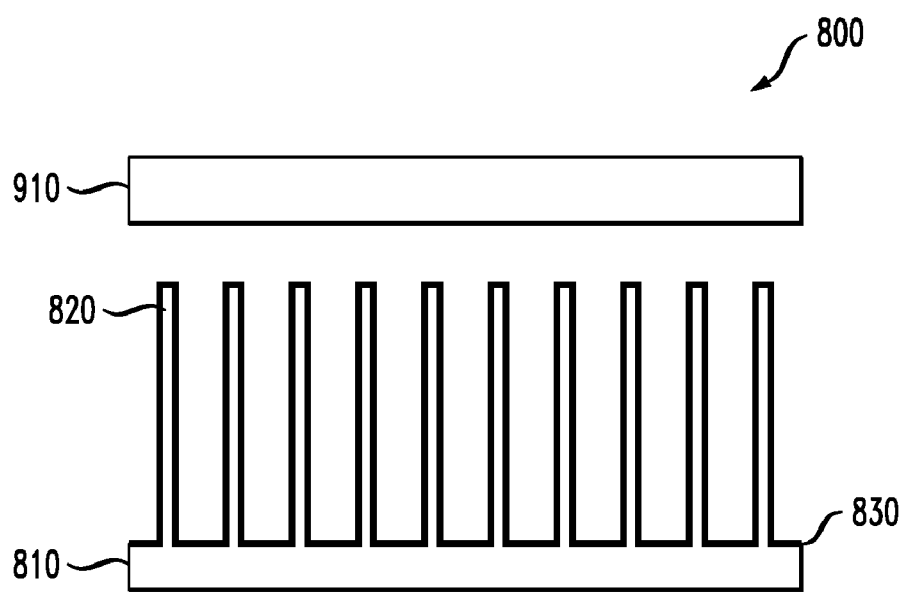

Turning now to FIG. 9, illustrated is the apparatus 800 of FIG. 8 after positioning a confining surface 910 over the plurality of nanostructures 820. The confining surface 910 may be substantially similar in material and manufacture to the confining surface 310. Thus, detail has already been given.

Figure 10:
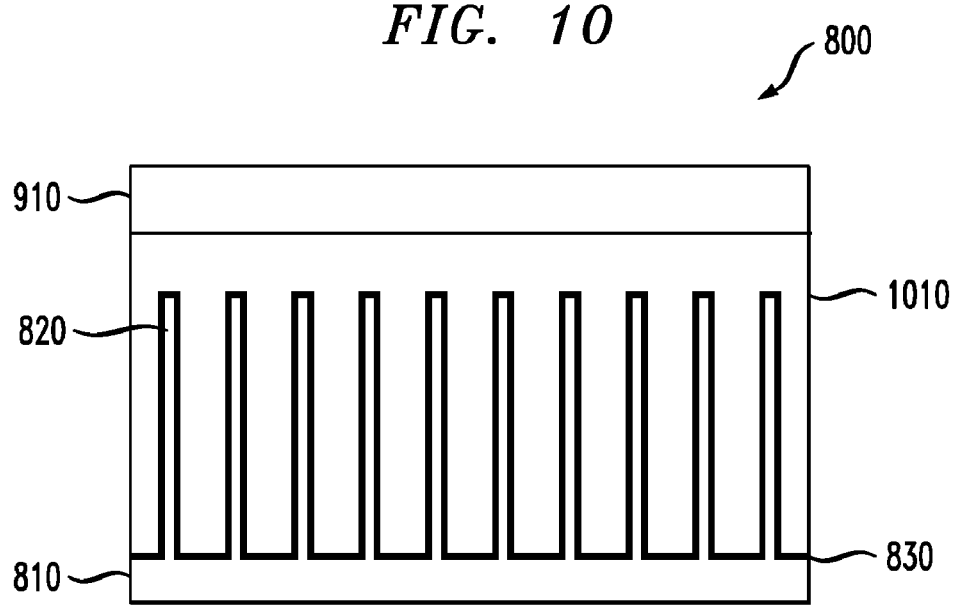

Turning further to FIG. 10, illustrated is the apparatus 800 of FIG. 9 after sandwiching a polymerizate solution 1010 between the substrate 810 and the confining surface 910, and thus surrounding the plurality of nanostructures 820 with the polymerizate solution 1010. The polymerizate solution 1010 may be placed between the substrate 810 and the confining surface 910 using many different processes, but in this embodiment is placed there using the same process as described above with respect to FIG. 4. The polymerizate solution 1010 may also comprise many different materials, but again in this embodiment it comprises a material substantially similar to the polymerizate solution 410 of FIG. 4.

Figure 11:
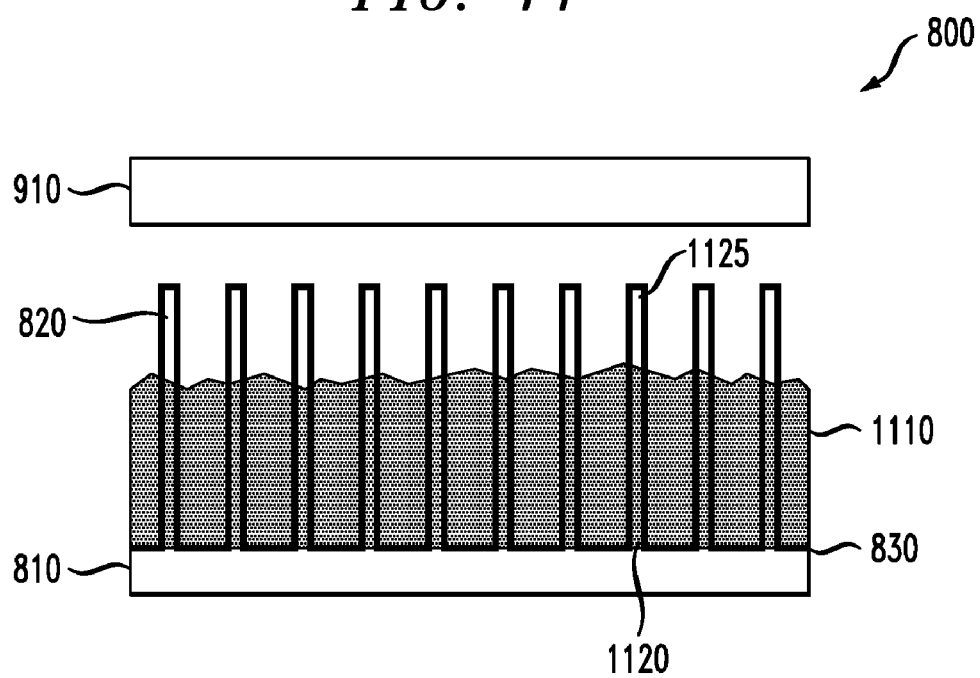

Turning now to FIG. 11, illustrated is the apparatus 800 of FIG. 10 after subjecting the polymerizate solution 1010 to a thermo-initiated polymerization step, and thereby forming a polymer layer 1110. The process for polymerizing the polymerizate solution 1010 may be substantially similar to that discussed above with respect to FIG. 5, but for a few exceptions. For example, the thermo-initiated polymerization in this embodiment is conducted at about 50° C. for about 40 minutes. Moreover, the substrate 810 and the confining surface 910, in this embodiment, are separated (e.g., without applying the shear stress) under water to prevent the breakage of the plurality of nanostructures 820. As a result of AA polymerization in-situ, the plurality of nanostructures 820 remain attached to the substrate 810, and thus are surrounded by the polymer layer 1110.

After conducting the polymerization reaction to form the polymer layer 1110, the apparatus 800 may be rinsed to remove unreacted monomers and cross-linked molecules there from. The resulting polymer layer 1110, as is illustrated, is attached to the substrate 810 via the anchoring layer 830. Moreover, the plurality of nanostructures 820 are located within the polymer layer 1110. More specifically, the first end 1120 of each of the plurality of nanostructures 820 is in contact with the substrate 810, wherein the second end 825 of each of the plurality of nanostructures 820 protrudes through the polymer layer 1110. Thereafter, the apparatus 800 may be dried in a vacuum, thus resulting in a contracted polymer layer with tilted nanostructures. What often results from the process of FIGS. 8-11 is an apparatus substantially similar to the apparatus 700 of FIGS. 7A and 7B.

Figure 12:
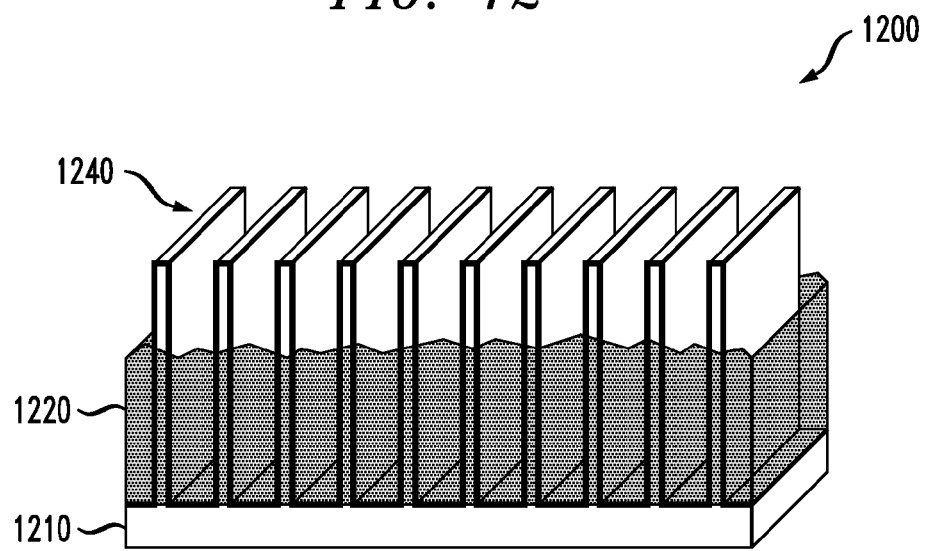
FIG. 12 illustrates an isometric view of an alternative embodiment of an apparatus manufactured in accordance with the principles of the present invention.

Turning briefly now to FIG. 12, illustrated is an isometric view of an alternative embodiment of an apparatus 1200 manufactured in accordance with the principles of the present invention. The apparatus 1200 of FIG. 12 is similar to the apparatus 700 of FIGS. 7A and 7B, with the exception that the plurality of nanostructures 1240 of FIG. 12 disposed in the polymer layer 1220 are nanoplates, as opposed to the nanoposts illustrated in FIGS. 7A and 7B. Those skilled in the art understand the processes that might be used to manufacture the apparatus 1200, especially in view of the above-discussions.

The apparatus 1200 of FIG. 12 is particularly useful as an array of microfluidic channels. For instance, when the polymer layer 1220 is expanded, and thus the plurality of nanostructures 1240 are in a vertical state, each pair of the nanostructures forms a microfluidic channel. However, when the polymer layer 1220 contracts, and thus tilts the plurality of nanostructures 1240, the microfluidic channels close. As opposed to microfluidic channels, the apparatus 1200 of FIG. 12 could also be configured as tunable photonic structures, micromanipulators, etc.

Figure 13:
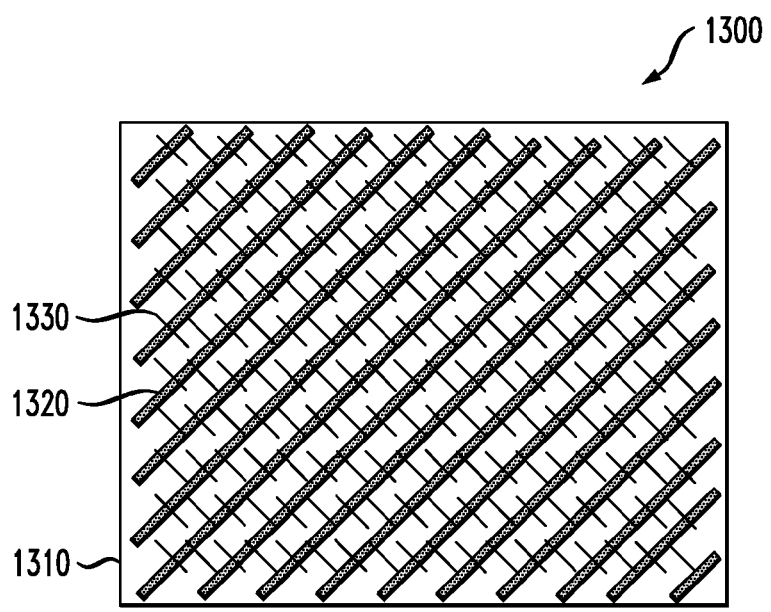
FIG. 13 illustrates a plan view of an apparatus manufactured in accordance with the principles of the present invention.

Turning briefly to FIG. 13, illustrated is a plan view of an apparatus 1300 manufactured in accordance with the principles of the present invention. FIG. 13 is used to illustrate that the apparatus 1300, and more particularly a surface of the substrate 1310, may have surface topography 1320 therein. The apparatus 1300 of FIG. 13 is similar to the apparatus 100 of FIGS. 1A and 1B, with the exception that the surface 1310 is topographically patterned. The surface topology 1320 is configured to cause the plurality of nanostructures 1330 to move in a predetermined direction. For instance, the surface topology 1320 may be designed to cause the plurality of nanostructures 1330 to move in a desired direction, as opposed to a random direction.

The surface topology 1320 may take on various different forms. In the embodiment of FIG. 13, the surface topology 1320 is configured as low aspect ratio non-planar structures (e.g., height to width ratio of less than 2:1), such as lines, that can promote the movement of the plurality of nanostructures 1330 in a predefined direction. In this embodiment, the plurality of nanostructures 1330 tilt in a way that is perpendicular to the lines. That is, the plurality of nanostructures 1330 tilt away from the lines when the polymer layer undergoes a volume transition, for example. Of course, the substrate 1310 could have other types or combinations of localized non-planarities such as valleys, trenches, or ridges configured to move the plurality of nanostructures 1330 in other predefined directions.

Figure 14:
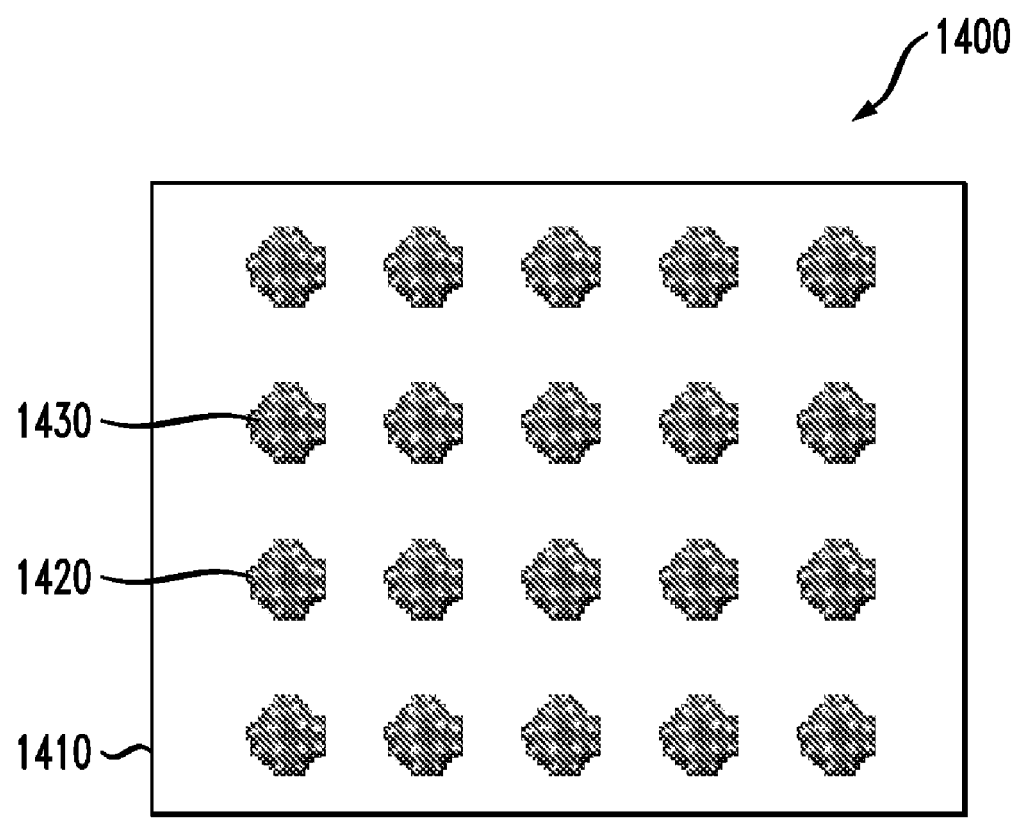
FIG. 14 illustrates a plan view of an apparatus manufactured in accordance with the principles of the present invention.

Turning finally to FIG. 14, illustrated is a plan view of an apparatus 1400 manufactured in accordance with the principles of the present invention. The apparatus 1400 of FIG. 14 additionally includes surface topography 1420 in the substrate 1410, however, as compared to the surface topography 1320 of FIG. 13, the surface topography 1420 is configured as a honeycomb like pattern. Accordingly, the plurality of nanostructures 1430 are radially-oriented, which cause them to form actuated "microflowers" that follow the geometry of the substrate 1410 when the polymer layer undergoes the volume transition.

Although the present invention has been described in detail, those skilled in the art should understand that they could make various changes, substitutions and alterations herein without departing from the spirit and scope of the invention in its broadest form.

What is claimed is:

1. An apparatus, comprising:
   a substrate with a surface;
   a polymer layer attached to a region of the surface;
   a plurality of nanostructures, a first end of each nanostructure being in the polymer layer and a second end of each nanostructure protruding from the polymer layer;
   wherein the nanostructures are configured to move in a predetermined direction from a first position to a second position in response to a change in thickness of the polymer layer from a first thickness thereof to a second thickness.

2. The apparatus as recited in claim 1 wherein the nanostructures are configured to tilt with respect to a normal of the surface in response to the change in thickness.

3. The apparatus as recited in claim 1 wherein the plurality of nanostructures are an array of nanoposts.

4. The apparatus as recited in claim 1 wherein the plurality of nanostructures are a plurality of nanoplates.

5. The apparatus as recited in claim 1 wherein the polymer layer is a hydrogel layer.

6. The apparatus as recited in claim 1 wherein the first end of each nanostructure is in direct contact with the surface.

7. The apparatus as recited in claim 1 wherein the first end of each nanostructure is separated from the surface.

8. The apparatus as recited in claim 1 wherein the nanostructures are configured to substantially return to the first position as the polymer layer returns toward the first thickness.

9. The apparatus as recited in claim 1 wherein the substrate has surface topological therein configured to cause the plurality of nanostructures to move in the predetermined direction.

10. The apparatus as recited in claim 1 wherein the thickness of the polymer layer is controlled using a stimulus selected from the group of:
   moisture change;
   temperature change;
   magnetic field change;
   electrical field change;
   pH change; and
   ion concentration change.

11. A method for using an apparatus, comprising:
   providing an apparatus, the apparatus including;
      a substrate with a surface;
      a polymer layer attached to a region of the surface; and a plurality of nanostructures, a first end of each nanostructure being in the polymer layer and a second end of each nano structure protruding through the polymer layer; and exposing the polymer layer to a stimulus, the stimulus changing a thickness of the polymer layer from a first thickness to a second thickness and thereby moving the nano structures in a predetermined direction from a first position to a second position.

12. The method as recited in claim 11 wherein exposing the polymer layer to a stimulus thereby tilts the nanostructures with respect to a normal of the surface.

13. The method as recited in claim 11, further including causing the thickness of the polymer layer to return to the first thickness, thereby substantially returning the nanostructures to the first position.

14. The method as recited in claim 11 wherein exposing the polymer layer to a stimulus includes exposing the polymer layer to a stimulus selected from the group consisting of:

moisture change;

temperature change;

magnetic field change;

electrical filed change pH change; and ion concentration change.

15. The method as recited in claim 11 wherein exposing the polymer layer closes one or more micro fluidic channels, tunable photonic structures or micromanipulators.

16. A method for manufacturing an apparatus, comprising:
providing a substrate with a surface;
forming a plurality of nanostructures, a first end of each nanostructure being in a polymer layer attached to a region of the surface and a second end of each nanostructure protruding through the polymer layer;
wherein the nanostructures are configured to move in a predetermined direction from a first position to a second position in response to a change in the thickness of the polymer layer from a first thickness to a second thickness.

17. The method as recited in claim 16 wherein the polymer layer is a hydrogel layer.

18. The method as recited in claim 16 wherein the first end of each nanostructure is in direct contact with the surface.

19. The method as recited in claim 16 wherein the first end of each nanostructure is separated from the surface.

20. The method as recited in claim 16 wherein providing a substrate with a surface includes providing a substrate with a surface having topography therein, the topography configured to cause the plurality of nanostructures to move in the predetermined direction.

* * * * *